United States Patent
Tsutsui et al.

(10) Patent No.: US 12,334,882 B2
(45) Date of Patent: Jun. 17, 2025

(54) RADIO-FREQUENCY AMPLIFIER CIRCUIT

(71) Applicant: Murata Manufacturing Co., Ltd., Kyoto (JP)

(72) Inventors: Takayuki Tsutsui, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 761 days.

(21) Appl. No.: 17/374,403

(22) Filed: Jul. 13, 2021

(65) Prior Publication Data
US 2022/0060157 A1 Feb. 24, 2022

(30) Foreign Application Priority Data
Aug. 24, 2020 (JP) .................... 2020-141019

(51) Int. Cl.
*H03F 1/30* (2006.01)
*H03F 1/56* (2006.01)
*H03F 3/21* (2006.01)

(52) U.S. Cl.
CPC .............. *H03F 3/211* (2013.01); *H03F 1/56* (2013.01); *H03F 2200/222* (2013.01); *H03F 2200/451* (2013.01)

(58) Field of Classification Search
CPC ................ H03F 1/30; H03F 3/20; H03G 3/30
USPC ................................................. 330/296, 285
See application file for complete search history.

(56) References Cited

U.S. PATENT DOCUMENTS

| | | | |
|---|---|---|---|
| 7,271,656 B2 * | 9/2007 | Joly | H03F 3/195 330/285 |
| 7,768,345 B2 * | 8/2010 | Aoki | H03F 3/343 330/296 |
| 8,994,455 B2 * | 3/2015 | Kim | H03F 3/19 330/207 P |
| 10,158,327 B2 | 12/2018 | Kim | |
| 2006/0244533 A1 | 11/2006 | Joly et al. | |
| 2007/0115062 A1 * | 5/2007 | Yamamoto | H03F 1/30 330/296 |
| 2014/0232471 A1 | 8/2014 | Kim | |
| 2015/0171797 A1 | 6/2015 | Ni et al. | |
| 2015/0333702 A1 | 11/2015 | Tsutsui et al. | |
| 2016/0118940 A1 * | 4/2016 | Whittaker | H03F 1/0261 330/296 |

FOREIGN PATENT DOCUMENTS

JP 5939404 B2 6/2016

* cited by examiner

*Primary Examiner* — Henry Choe
(74) *Attorney, Agent, or Firm* — McDonald Hopkins LLC

(57) ABSTRACT

A radio-frequency amplifier circuit includes a first amplifier transistor configured to amplify and output a radio-frequency signal supplied to a base of the first amplifier transistor, a first bias transistor that is connected to the first amplifier transistor to form a current mirror and configured to supply a bias to the base of the first amplifier transistor, a second bias transistor that is connected to the base of the first amplifier transistor to form an emitter follower and configured to supply a bias to the base of the first amplifier transistor, and a first capacitor having a first end connected to the base of the first amplifier transistor and a second end connected to an emitter of the second bias transistor.

9 Claims, 13 Drawing Sheets

RADIO-FREQUENCY AMPLIFIER CIRCUIT

CROSS REFERENCE TO RELATED APPLICATION

This application claims priority from Japanese Patent Application No. 2020-141019 filed on Aug. 24, 2020. The content of this application is incorporated herein by reference in its entirety.

BACKGROUND

The present disclosure relates to a radio-frequency amplifier circuit.

In mobile communication devices, such as cellular phones, RF amplifier circuits are used to amplify the power of radio-frequency (RF) signals to be transmitted to base stations. Such an RF amplifier circuit includes an amplifier circuit for amplifying an RF signal and a bias circuit for biasing an amplifier transistor forming the amplifier circuit (e.g., Japanese Patent No. 5939404).

In the RF amplifier circuit disclosed in Japanese Patent No. 5939404, a first bias transistor that is connected to an amplifier transistor to form a current mirror and a second bias transistor that is connected to the amplifier transistor to form an emitter follower supply respective biases to the amplifier transistor.

In the RF amplifier circuit disclosed in Japanese Patent No. 5939404, even when a low control voltage of 2.35 V is applied to the base of the second bias transistor, the supply of a bias is performed by the first bias transistor in a low-level region in which the signal level of an RF signal is low and is performed by the second bias transistor in a high-level region in which the signal level of an RF signal is high. Accordingly, the change in gain in the RF amplifier circuit is suppressed in a region from the low-level region to the high-level region.

There is a case where the output phase of an RF signal amplified and output by the RF amplifier circuit (hereinafter sometimes referred to as an output signal) changes in accordance with the signal level of the output signal. It is desired that the output phase of an output signal be constant irrespective of the signal level of the output signal.

BRIEF SUMMARY

The present disclosure provides an RF amplifier circuit that suppresses the change in the output phase of an output signal irrespective of the signal level of the output signal.

A radio-frequency amplifier circuit according to an aspect of the present disclosure includes a first amplifier transistor configured to amplify and output a radio-frequency signal supplied to a base of the first amplifier transistor, a first bias transistor that is connected to the first amplifier transistor to form a current mirror and configured to supply a bias to the base of the first amplifier transistor, a second bias transistor that is connected to the base of the first amplifier transistor to form an emitter follower and configured to supply a bias to the base of the first amplifier transistor, and a first capacitor having a first end connected to the base of the first amplifier transistor and a second end connected to an emitter of the second bias transistor.

According to the present disclosure, there can be provided an RF amplifier circuit that suppresses the change in the output phase of an output signal irrespective of the signal level of the output signal.

Other features, elements, characteristics and advantages of the present disclosure will become more apparent from the following detailed description of embodiments of the present disclosure with reference to the attached drawings.

DETAILED DESCRIPTION

Figure 1:
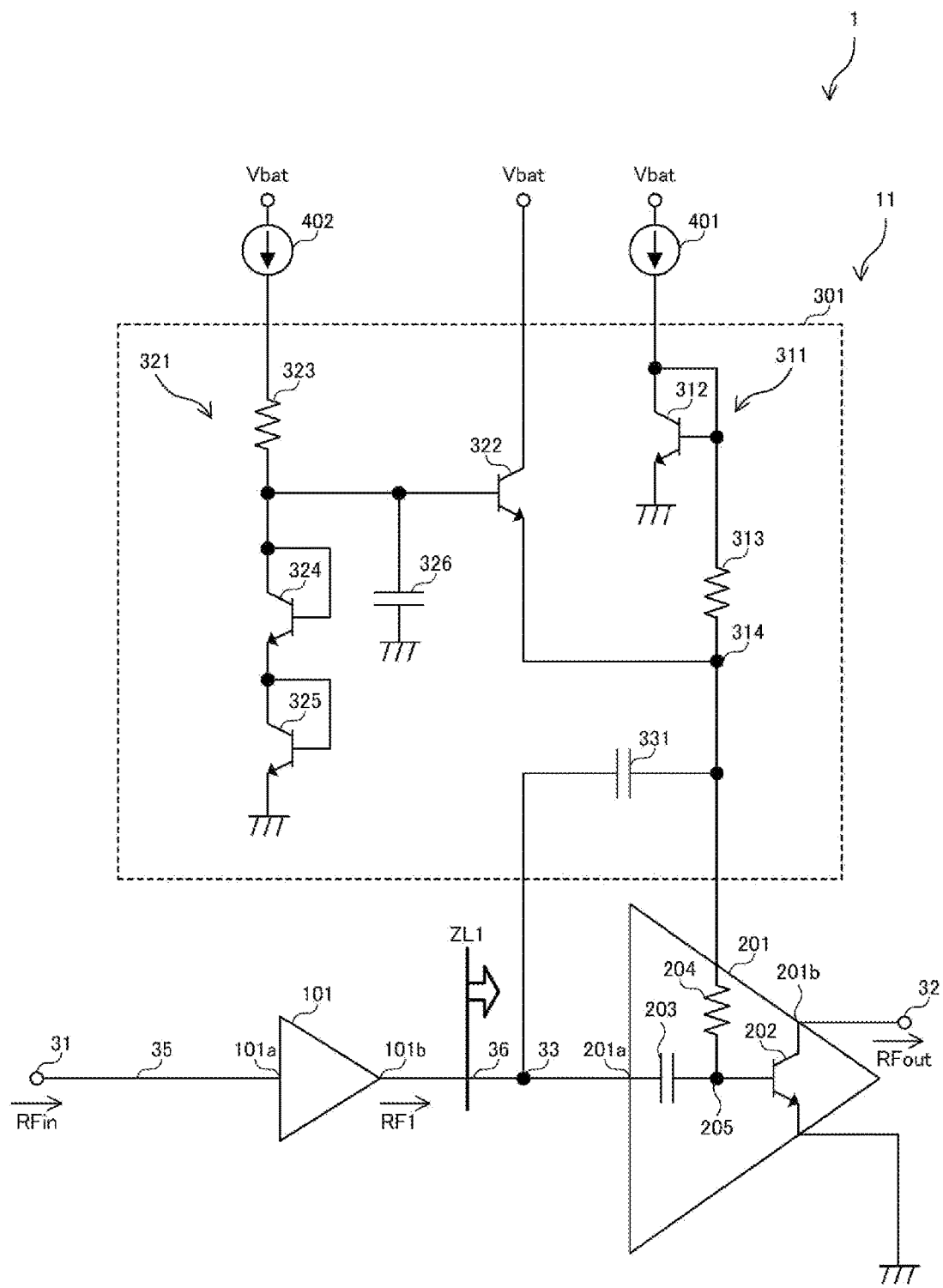
FIG. 1 is a circuit diagram of a power amplifier circuit according to a first embodiment of the present disclosure.

Embodiments of the present disclosure will be described in detail below with reference to the accompanying drawings. The same reference numeral is used to represent the same component or the same part to avoid repeated explanation as much as possible.

[First Embodiment]

A power amplifier circuit according to the first embodiment will be described. FIG. 1 is a circuit diagram of a power amplifier circuit according to the first embodiment of the present disclosure. A power amplifier circuit 1 includes an RF amplifier circuit 11 and current sources 401 and 402. The RF amplifier circuit 11 includes a bias circuit 301 and amplifiers 101 and 201. The RF amplifier circuit 11 amplifies an input signal (RF signal) RFin input from an RF signal input terminal 31 and outputs an output signal (amplified signal) RFout from an RF signal output terminal 32.

In this embodiment, an amplifier is a bipolar transistor, such as a heterojunction bipolar transistor (HBT). An HBT is made of gallium arsenide (GaAs), but may be made of another semiconductor material.

The amplifier 101 is a first-stage (driver-stage) amplifier and the amplifier 201 is an output-stage (power-stage) amplifier. The amplifiers 101 and 201 have the same configuration, and the detailed description of the amplifier 101 will be omitted.

The amplifier 101 has an input terminal 101a connected to the RF signal input terminal 31 for receiving the supply of the input signal RFin through a wiring line 35 and an output terminal 101b connected to a wiring line 36 in which an interstage node 33 is provided. The amplifier 101 amplifies the input signal RFin input from the input terminal 101a and outputs an amplification signal RF1, which is a result of the amplification, from the output terminal 101b.

The amplifier 201 has an input terminal 201a connected to the output terminal 101b of the amplifier 101 through the wiring line 36 and an output terminal 201b connected to the RF signal output terminal 32. The amplifier 201 amplifies the amplification signal RF1 input from the input terminal 201a and outputs the output signal RFout obtained as a result of the amplification of the amplification signal RF1 from the output terminal 201b.

Specifically, the amplifier 201 further includes an amplifier transistor 202 (first amplifier transistor), a capacitor 203, and a resistance element 204. The capacitor 203 functions as a matching circuit that performs impedance matching between the amplifier 101 and the amplifier transistor 202 and has a first end connected to the input terminal 201a and a second end connected to a last-stage HBT bias node 205.

The resistance element 204 has a first end connected to a bias supply node 314 to which a bias is supplied from the bias circuit 301 and a second end connected to the last-stage HBT bias node 205. The amplifier transistor 202 has a collector connected to the output terminal 201b, a base connected to the last-stage HBT bias node 205, and a grounded emitter. The amplifier transistor 202 amplifies the amplification signal RF1 supplied to the base thereof and outputs the output signal RFout, which is a result of the amplification, to the RF signal output terminal 32 through the output terminal 201b. Although not illustrated, a power supply voltage is supplied to the collector of the amplifier transistor 202. In the wiring line connecting the collector of the amplifier transistor 202 and a power supply, for example, a resistance element, a capacitor, and an inductor may be provided.

Each of the current sources 401 and 402 is formed of, for example, a P-channel metal oxide semiconductor (PMOS) and has a first end connected to a power supply node to which a battery voltage Vbat is supplied and a second end from which a current is output.

The bias circuit 301 includes a current-mirror-side circuit 311, an emitter-follower-side circuit 321, and a capacitor 331 (first capacitor). The bias circuit 301 supplies a bias to the amplifier transistor 202 in the amplifier 201 in accordance with currents received from the current sources 401 and 402.

The emitter-follower-side circuit 321 includes a bias transistor 322 (second bias transistor), a resistance element 323, transistors 324 and 325, and a capacitor 326. The emitter-follower-side circuit 321 supplies a bias to the base of the amplifier transistor 202 in accordance with a current supplied from the current source 402.

Specifically, the resistance element 323, the transistors 324 and 325, and the capacitor 326 supply a bias having a predetermined voltage to the base of the bias transistor 322. More specifically, the resistance element 323 has a first end to which a current is supplied from the current source 402 and a second end. The transistor 324 has a collector connected to the second end of the resistance element 323, a base connected to the collector, and an emitter. The connection between the collector and base of a transistor is hereinafter sometimes referred to as a diode connection. The transistor 325 is diode-connected and has a collector connected to the emitter of the transistor 324 and a grounded emitter. Since each of the transistors 324 and 325 functions as a diode, a voltage drop across two diodes occur in collector-emitter paths of the transistors 324 and 325. That is, a collector-base voltage of the transistor 324 with respect to the ground corresponds to the amount of the voltage drop across two diodes.

The capacitor 326 has a first end connected to the second end of the resistance element 323 and the collector of the transistor 324 and a grounded second end. The capacitor 326 stabilizes the collector-base voltage of the transistor 324.

The bias transistor 322 is connected to the base of the amplifier transistor 202 to form an emitter follower and supplies a bias to the base of the amplifier transistor 202. Specifically, the bias transistor 322 has a collector connected to the power supply node to which the battery voltage Vbat is supplied, a base connected to the second end of the resistance element 323, the collector of the transistor 324, and the first end of the capacitor 326, and an emitter connected to the bias supply node 314. Since the emitter of the bias transistor 322 is connected to the base of the amplifier transistor 202 via the resistance element 204, the bias transistor 322 and the resistance element 204 form an emitter-follower circuit.

The current-mirror-side circuit 311 includes a bias transistor 312 (first bias transistor) and a resistance element 313 (first resistance element).

The bias transistor 312 is connected to the amplifier transistor 202 to form a current mirror and supplies a bias to the base of the amplifier transistor 202. Specifically, the bias transistor 312 is diode-connected and has a collector to which a current is supplied from the current source 401 and a grounded emitter.

The resistance element 313 has a first end connected to the collector and base of the bias transistor 312 and a second end connected to the bias supply node 314. It is desired that the resistance value of the resistance element 313 be, for example, from 30 Ω to 800 Ω. The reason for this will be described below.

Since the base of the diode-connected bias transistor 312 is connected to the base of the amplifier transistor 202 via the resistance elements 313 and 204, the bias transistor 312 and the amplifier transistor 202 form a current mirror circuit. When a current flows through the collector of the bias transistor 312, a current corresponding to the size ratio between the bias transistor 312 and the amplifier transistor 202 flows through the collector of the amplifier transistor 202.

The capacitor 331 has a first end connected to the interstage node 33 and a second end connected to the bias supply node 314. The function of the capacitor 331 will be described below.

[Problem]

The power amplifier circuit 1 is included in, for example, a mobile communication device, such as a cellular phone. To increase a transmission capacity in wireless communication, a high-speed communication technique, such as carrier aggregation (CA) is employed in such a mobile communication device with which wireless communication is performed using radio waves in multiple frequency bands. The configuration of a front-end circuit in the mobile communication device is therefore complex. When radio waves in the sub-6 GHz band for the 5th generation mobile communication system (5G) are used in a mobile communication device, the configuration of a front-end circuit in the mobile communication device becomes more complex. When the configuration of a front-end circuit becomes complex, a load loss in an RF amplifier circuit increases. Accordingly, RF amplifier circuits need not only the technique for amplifying radio waves in a plurality of frequency bands but also the technique for generating a radio wave of high power by amplification. In addition, since there is an increase in user demand for the extension of battery life with the increase in the number of applications simultaneously used in a mobile communication device, mobile communication devices need to achieve the reduction in power consumption.

For example, lithium-ion batteries are used in mobile communication devices. For the extension of the life of a lithium-ion battery, the method is sometimes effective of reducing the prescribed minimum voltage value (e.g., reducing from 3 volts to 2.7 volts).

However, in the configuration in which an emitter-follower circuit supplies a bias to an amplifier transistor, the DC bias current of the amplifier transistor sometimes becomes substantially zero when the battery voltage decreases to 2.7 volts.

Specifically, a base-emitter rising voltage Vbe of an HBT made of GaAs (hereinafter sometimes referred to as a GaAs-HBT) is, for example, approximately 1.35 volts. When an emitter-follower circuit supplies a bias to the base of an amplifier transistor, the DC bias current of the amplifier transistor becomes substantially zero because the sum of the base-emitter rising voltages Vbe of a bias transistor and an amplifier transistor in the emitter-follower circuit is substantially the same as a battery voltage. In particular, since the base-emitter rising voltage Vbe becomes high at low temperatures, the significant reduction in the gain of an amplifier transistor occurs because of the insufficient bias of the amplifier transistor.

There is a method using the BiHEMT (GaAs HBT-HEMT) process of simultaneously integrating a GaAs-HBT and a field effect transistor (FET) having a low rising voltage. However, in the case of this method, a process control is complicated because of the increase in conditions for the production of homogeneous products and a process cost is increased. Accordingly, for the configuration in which an emitter-follower circuit supplies a bias to an amplifier transistor, a technique is needed for appropriately supplying a bias to the amplifier transistor even when a voltage supplied to the emitter-follower circuit is low.

First Reference Example

Figure 2:
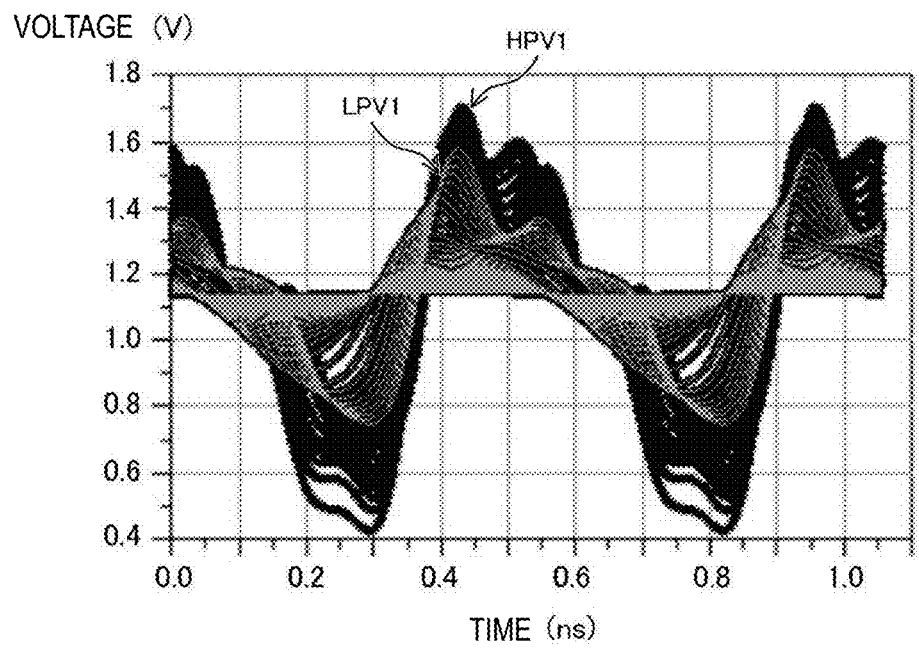
FIG. 2 is a diagram illustrating an exemplary time change in voltage at the base of an amplifier transistor according to a first reference example.

FIG. 2 is a diagram illustrating an exemplary time change in voltage at the base of an amplifier transistor according to a first reference example. In FIG. 2, the horizontal axis represents time in units of "ns" and the vertical axis represents voltage in units of "V".

In a bias circuit included in an RF amplifier circuit according to the first reference example (hereinafter sometimes referred to as a first reference circuit), the current-mirror-side circuit 311 and the capacitor 331, which are included in the bias circuit 301 illustrated in FIG. 1, are not provided. That is, the bias circuit included in the first reference circuit includes only the emitter-follower-side circuit 321.

The inventors conducted a simulation of the operation of the first reference circuit when the base-emitter rising voltages Vbe of the bias transistor 322 and the amplifier transistor 202 were 1.35 volts and the battery voltage Vbat of 2.7 volts was supplied. The frequency of the input signal RFin was 1.9 GHz.

FIG. 2 illustrates voltage waveform groups HPV1 and LPV1 representing the time change in voltage at the last-stage HBT bias node 205. The voltage waveform group HPV1 was obtained when the input signal RFin was input to the RF signal input terminal 31 while power was changed in steps of 1 dBm in the range of high power including 3 dBm (hereinafter sometimes referred to as "at the time of a large-signal operation"). The voltage waveform group LPV1 was obtained when the input signal RFin was input to the RF signal input terminal 31 while power was changed in steps of 1 dBm in the range of low power including −10 dBm (hereinafter sometimes referred to as "at the time of a small-signal operation"). A voltage of up to approximately 1.7 volts is supplied to the last-stage HBT bias node 205 at the time of a large-signal operation.

Figure 3:
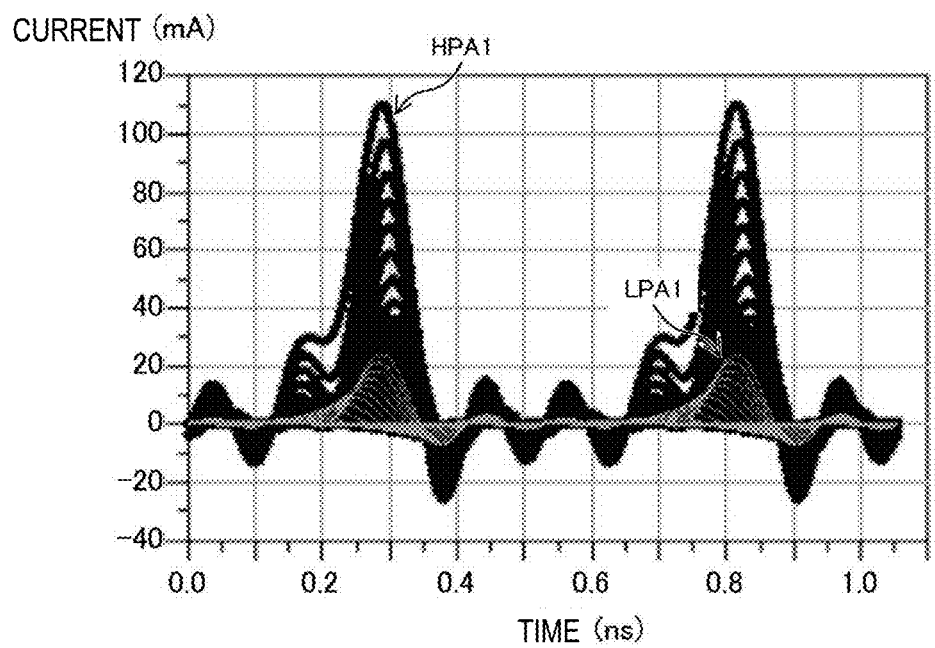
FIG. 3 is a diagram illustrating an exemplary time change in current at the base of an amplifier transistor according to the first reference example.

FIG. 3 is a diagram illustrating an exemplary time change in current at the base of an amplifier transistor according to the first reference example. In FIG. 3, the horizontal axis represents time in units of "ns" and the vertical axis represents current in units of "mA".

FIG. 3 illustrates current waveform groups HPA1 and LPA1 representing the time change in current at the last-stage HBT bias node 205. The current waveform group HPA1 is a current waveform group at the time of a large-signal operation and corresponds to the voltage waveform group HPV1. The current waveform group LPA1 is a current waveform group at the time of a small-signal operation and corresponds to the voltage waveform group LPV1.

As illustrated in FIGS. 2 and 3, at the time of a small-signal operation, there is a current flow through the last-stage HBT bias node 205 at approximately 0.3 ns and approximately 0.8 ns but little flow of a bias current in a certain period between these times.

Figure 4:
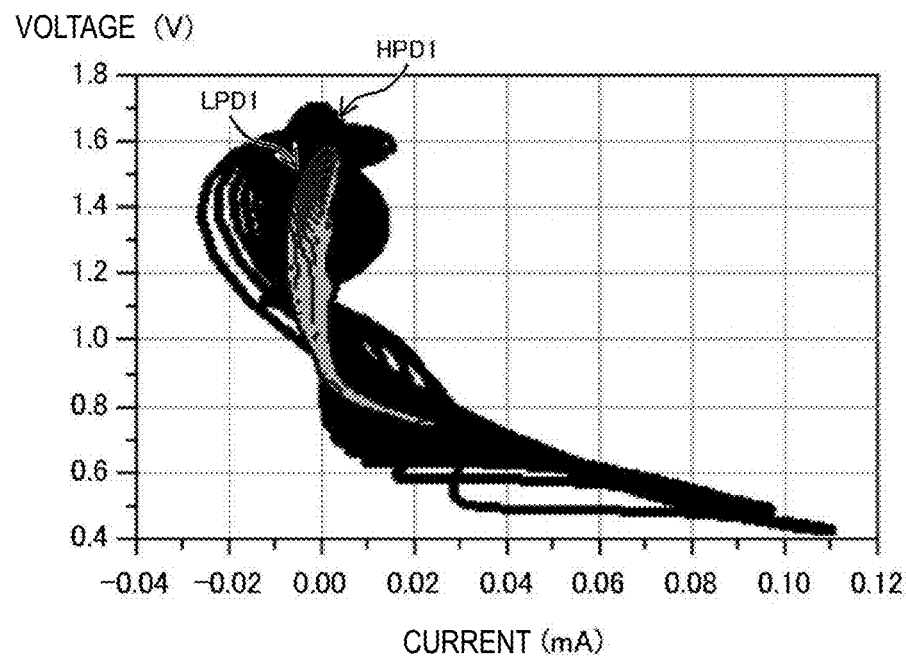
FIG. 4 is a diagram illustrating exemplary current-voltage characteristics at the base of an amplifier transistor according to the first reference example.

FIG. 4 is a diagram illustrating exemplary current-voltage characteristics at the base of an amplifier transistor according to the first reference example. In FIG. 4, the horizontal axis represents current in units of "mA" and the vertical axis represents voltage in units of "V".

FIG. 4 illustrates a dynamic load line HPD1 based on the voltage waveform group HPV1 and the current waveform group HPA1 and a dynamic load line LPD1 based on the voltage waveform group LPV1 and the current waveform group LPA1. A dynamic load line is obtained by plotting the sets of a voltage value and a current value at the same time.

As illustrated in FIG. 4, a region where the dynamic load line LPD1 at the time of a small-signal operation is located is widely distributed. In this case, characteristics representing the relationship between output power and a gain (hereinafter sometimes referred to as AM/AM characteristics) are sometimes deteriorated. Specifically, the gain at the time of a small-signal operation falls below the gain at the time of a large-signal operation. AM/AM characteristics will be described in detail below.

The region where the dynamic load line LPD1 at the time of a small-signal operation is located includes a part along the scale mark of 0 mA. The reason for this is that almost no bias current flows through the amplifier transistor 202 because the battery voltage Vbat is low and the base-emitter rising voltage Vbe cannot be supplied to the last-stage HBT bias node 205 only by the emitter-follower-side circuit 321. That is, it is difficult that a bias enabling the first reference circuit to operate as a class A amplifier circuit is supplied to the amplifier transistor 202 only by the emitter-follower-side circuit 321.

Second Reference Example

Figure 5:
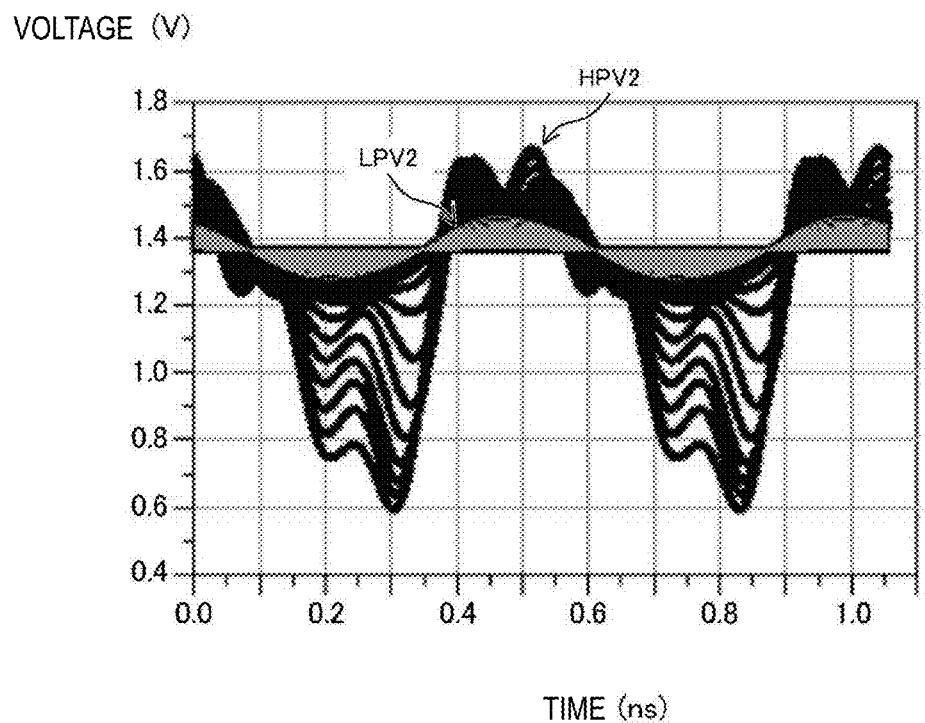
FIG. 5 is a diagram illustrating an exemplary time change in voltage at the base of an amplifier transistor according to a second reference example.

FIG. 5 is a diagram illustrating an exemplary time change in voltage at the base of an amplifier transistor according to the second reference example. FIG. 5 is viewed in the same manner as FIG. 2.

In a bias circuit included in an RF amplifier circuit according to the second reference example (hereinafter sometimes referred to as a second reference circuit), the capacitor 331 included in the bias circuit 301 illustrated in FIG. 1 is not provided. That is, the bias circuit included in the second reference circuit includes the emitter-follower-side circuit 321 and the current-mirror-side circuit 311.

The inventors conducted a simulation of the operation of the second reference circuit when the base-emitter rising voltages Vbe of the bias transistor 322 and the amplifier transistor 202 were 1.35 volts and the battery voltage Vbat of 2.7 volts was supplied.

FIG. 5 illustrates voltage waveform groups HPV2 and LPV2 representing the time change in voltage at the last-stage HBT bias node 205. The voltage waveform group HPV2 is a voltage waveform group at the time of a large-signal operation and the voltage waveform group LPV2 is a voltage waveform group at the time of a small-signal operation. A voltage of up to approximately 1.7 volts is supplied to the last-stage HBT bias node 205 at the time of a large-signal operation.

Figure 6:
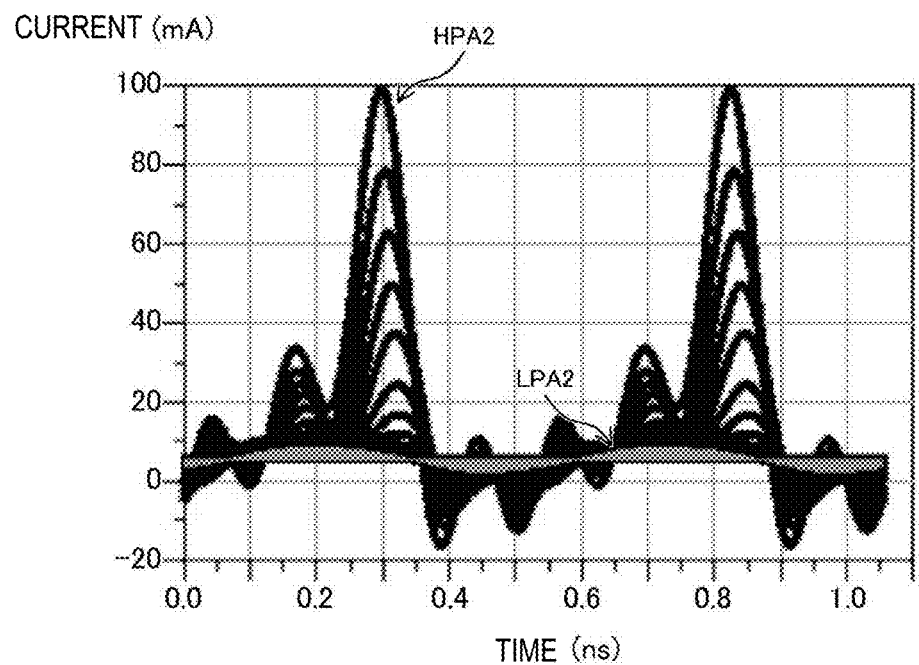
FIG. 6 is a diagram illustrating an exemplary time change in current at the base of an amplifier transistor according to the second reference example.

FIG. 6 is a diagram illustrating an exemplary time change in current at the base of an amplifier transistor according to the second reference example. FIG. 6 is viewed in the same manner as FIG. 3.

FIG. 6 illustrates current waveform groups HPA2 and LPA2 representing the time change in current at the last-stage HBT bias node 205. The current waveform group HPA2 is a current waveform group at the time of a large-signal operation and corresponds to the voltage waveform group HPV2. The current waveform group LPA2 is a current waveform group at the time of a small-signal operation and corresponds to the voltage waveform group LPV2.

As illustrated in FIGS. 5 and 6, at the time of a small-signal operation, the amplifier transistor 202 receives the supply of a constant idling current from the current-mirror-side circuit 311 because a current flows through the last-stage HBT bias node 205.

Figure 7:
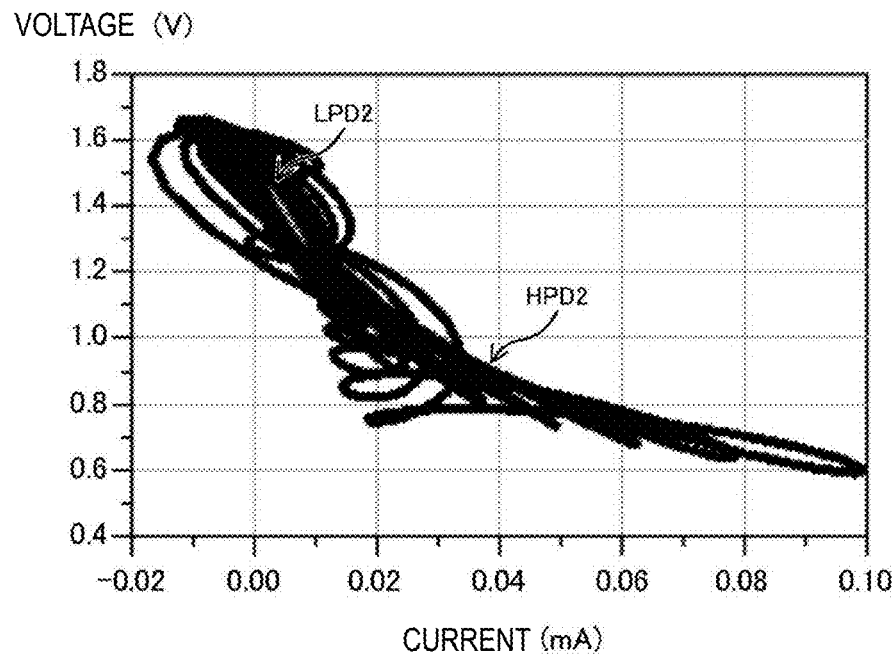
FIG. 7 is a diagram illustrating exemplary current-voltage characteristics at the base of an amplifier transistor according to the second reference example.

FIG. 7 is a diagram illustrating exemplary current-voltage characteristics at the base of an amplifier transistor according to the second reference example. FIG. 7 is viewed in the same manner as FIG. 4.

FIG. 7 illustrates a dynamic load line HPD2 based on the voltage waveform group HPV2 and the current waveform group HPA2 and a dynamic load line LPD2 based on the voltage waveform group LPV2 and the current waveform group LPA2.

A region where the dynamic load line LPD2 at the time of a small-signal operation is located is narrower than the region where the dynamic load line LPD1 illustrated in FIG. 4 is located. The reason for this is that the fall of a gain at the time of a small-signal operation is improved because of the supply of a constant idling current from the current-mirror-side circuit 311 to the amplifier transistor 202 and AM/AM characteristics are improved.

The dynamic load line LPD2 at the time of a small-signal operation is located such that a voltage increases with decrease in current and a voltage decrease with increase in current. The reason for this is that a current and a voltage are 180° out of phase with each other. In this case, characteristics representing the relationship between output power and an output phase (hereinafter sometimes referred to as AM/PM characteristics) are sometimes deteriorated. Specifically, an output phase does not become constant and changes with the change in output power. AM/PM characteristics will be described in detail below.

It is desired that the region where a dynamic load line at the time of a small-signal operation is located be narrow and a current and a voltage be in phase with each other.

Third Reference Example

Figure 8:
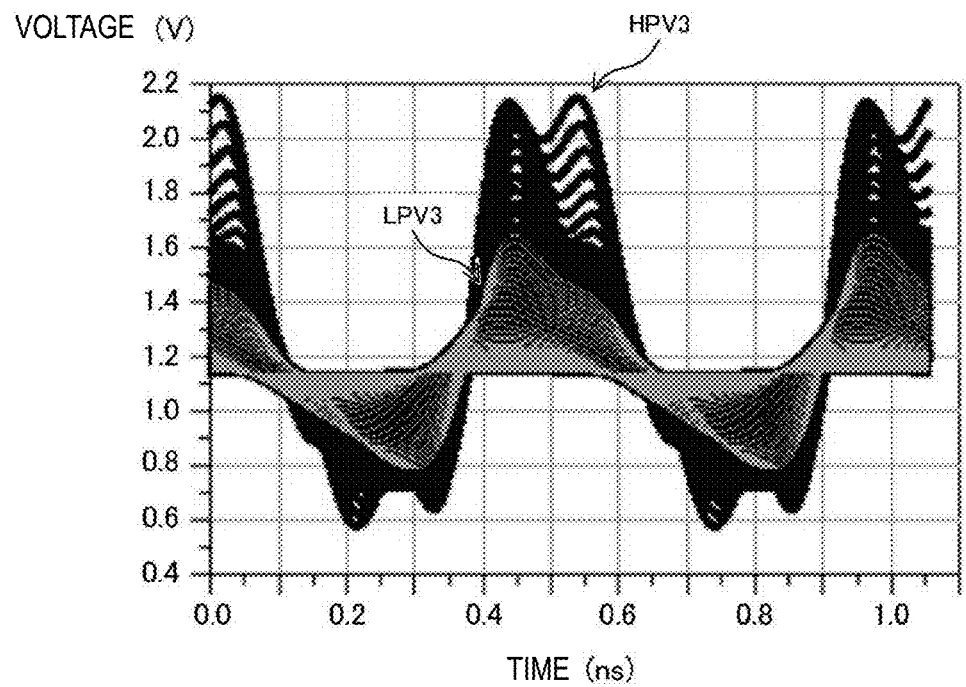
FIG. 8 is a diagram illustrating an exemplary time change in voltage at the base of an amplifier transistor according to a third reference example.

FIG. 8 is a diagram illustrating an exemplary time change in voltage at the base of an amplifier transistor according to the third reference example. FIG. 8 is viewed in the same manner as FIG. 2.

An RF amplifier circuit according to the third reference example (hereinafter sometimes referred to as a third reference circuit) does not include the current-mirror-side circuit 311 included in the bias circuit 301 illustrated in FIG. 1. That is, a bias circuit included in the third reference circuit includes the emitter-follower-side circuit 321 and the capacitor 331.

The inventors conducted a simulation of the operation of the third reference circuit when the base-emitter rising voltages Vbe of the bias transistor 322 and the amplifier transistor 202 were 1.35 volts and the battery voltage Vbat of 2.7 volts was supplied.

FIG. 8 illustrates voltage waveform groups HPV3 and LPV3 representing the time change in voltage at the last-stage HBT bias node 205. The voltage waveform group HPV3 is a voltage waveform group at the time of a large-signal operation and the voltage waveform group LPV3 is a voltage waveform group at the time of a small-signal operation. A voltage of up to approximately 2.15 volts is supplied to the last-stage HBT bias node 205 at the time of a large-signal operation.

Figure 9:
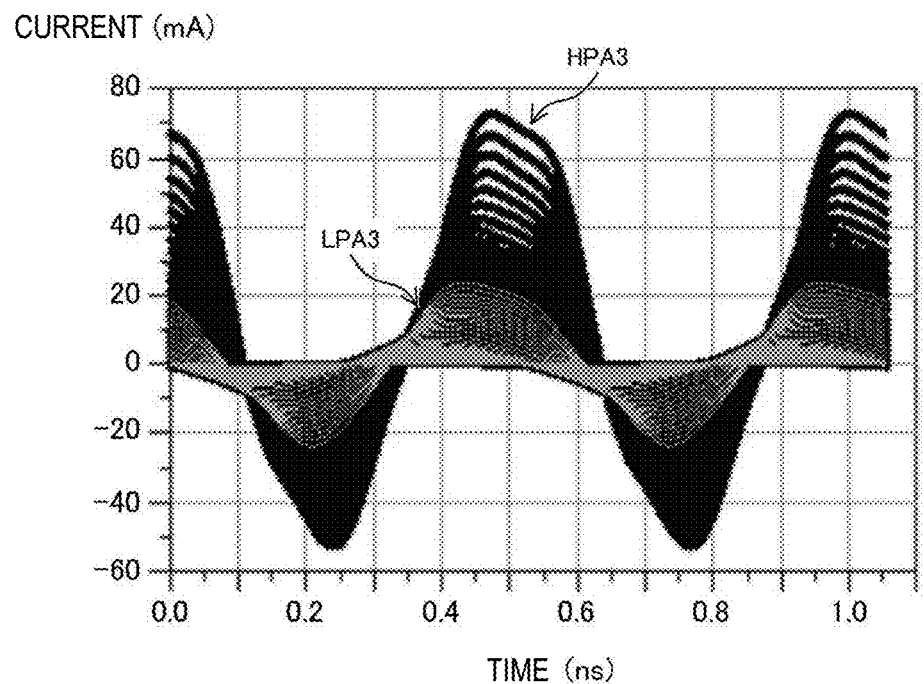
FIG. 9 is a diagram illustrating an exemplary time change in current at the base of an amplifier transistor according to the third reference example.

FIG. 9 is a diagram illustrating an exemplary time change in current at the base of an amplifier transistor according to the third reference example. FIG. 9 is viewed in the same manner as FIG. 3.

FIG. 9 illustrates current waveform groups HPA3 and LPA3 representing the time change in current at the last-stage HBT bias node 205. The current waveform group HPA3 is a current waveform group at the time of a large-signal operation and corresponds to the voltage waveform group HPV3. The current waveform group LPA3 is a current waveform group at the time of a small-signal operation and corresponds to the voltage waveform group LPV3.

Figure 10:
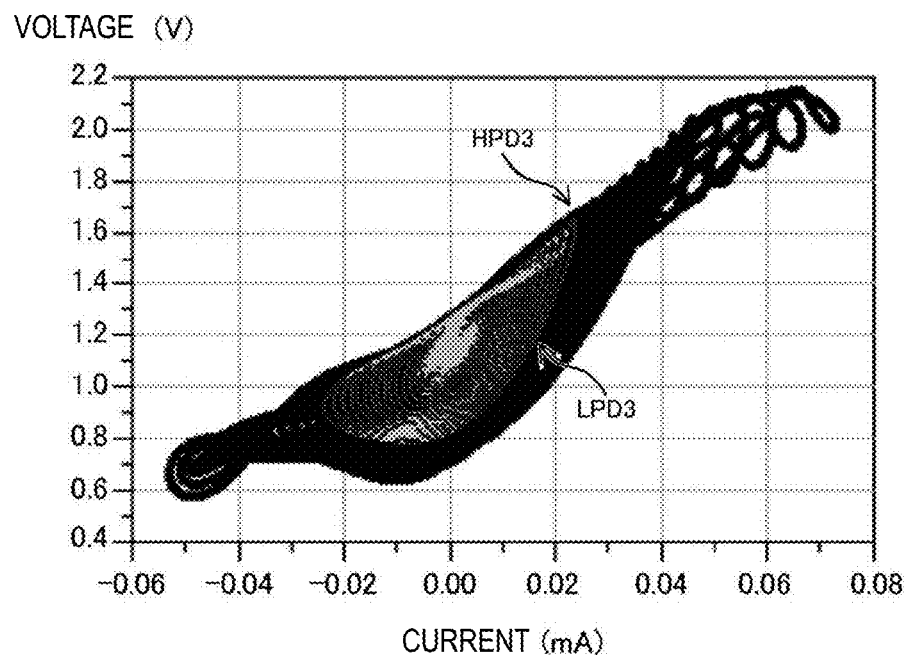
FIG. 10 is a diagram illustrating exemplary current-voltage characteristics at the base of an amplifier transistor according to the third reference example.

FIG. 10 is a diagram illustrating exemplary current-voltage characteristics at the base of an amplifier transistor according to the third reference example. FIG. 10 is viewed in the same manner as FIG. 4.

FIG. 10 illustrates a dynamic load line HPD3 based on the voltage waveform group HPV3 and the current waveform group HPA3 and a dynamic load line LPD3 based on the voltage waveform group LPV3 and the current waveform group LPA3.

The dynamic load line LPD3 at the time of a small-signal operation is located such that a voltage deceases with decrease in current and a voltage increase with increase in current. That is, the third reference circuit is improved as compared with the second reference circuit such that a current and a voltage be in phase with each other.

However, a region where the dynamic load line LPD3 at the time of a small-signal operation is located is wider than the region where the dynamic load line LPD2 illustrated in FIG. 7 is located. Accordingly, the AM/AM characteristics of the third reference circuit are deteriorated as compared with the AM/AM characteristics of the second reference circuit.

[Operational Effect]

Figure 11:
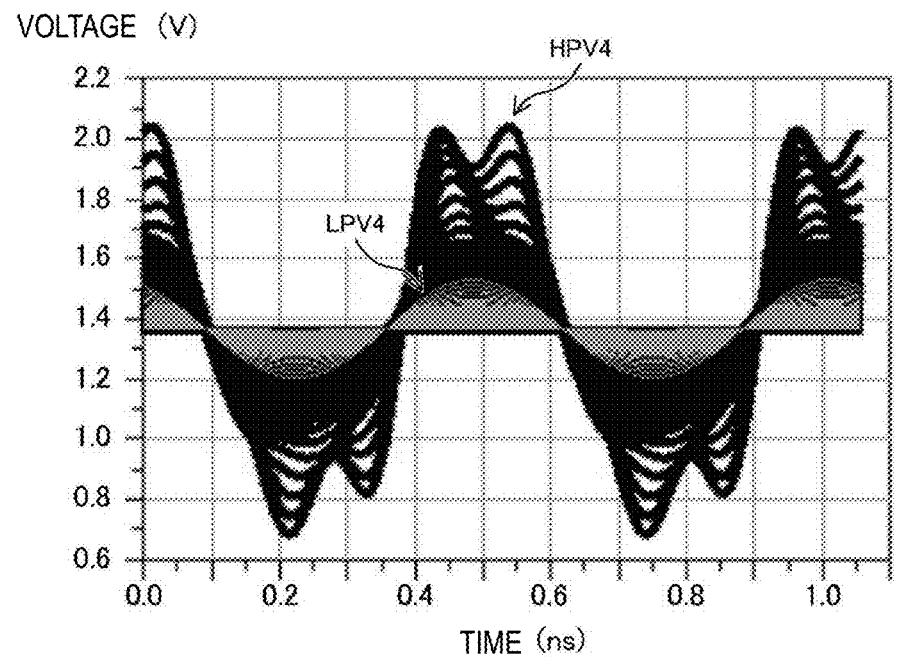
FIG. 11 is a diagram illustrating an exemplary time change in voltage at the base of an amplifier transistor according to a first embodiment of the present disclosure.

FIG. 11 is a diagram illustrating an exemplary time change in voltage at the base of an amplifier transistor according to a first embodiment of the present disclosure. FIG. 11 is viewed in the same manner as FIG. 2.

The inventors conducted a simulation of the operation of the RF amplifier circuit 11 when the base-emitter rising voltages Vbe of the bias transistor 322 and the amplifier transistor 202 were 1.35 volts and the battery voltage Vbat of 2.7 volts was supplied.

FIG. 11 illustrates voltage waveform groups HPV4 and LPV4 representing the time change in voltage at the last-stage HBT bias node 205. The voltage waveform group HPV4 is a voltage waveform group at the time of a large-signal operation and the voltage waveform group LPV4 is a voltage waveform group at the time of a small-signal operation. A voltage of up to approximately 2.05 volts is supplied to the last-stage HBT bias node 205 at the time of a large-signal operation.

Figure 12:
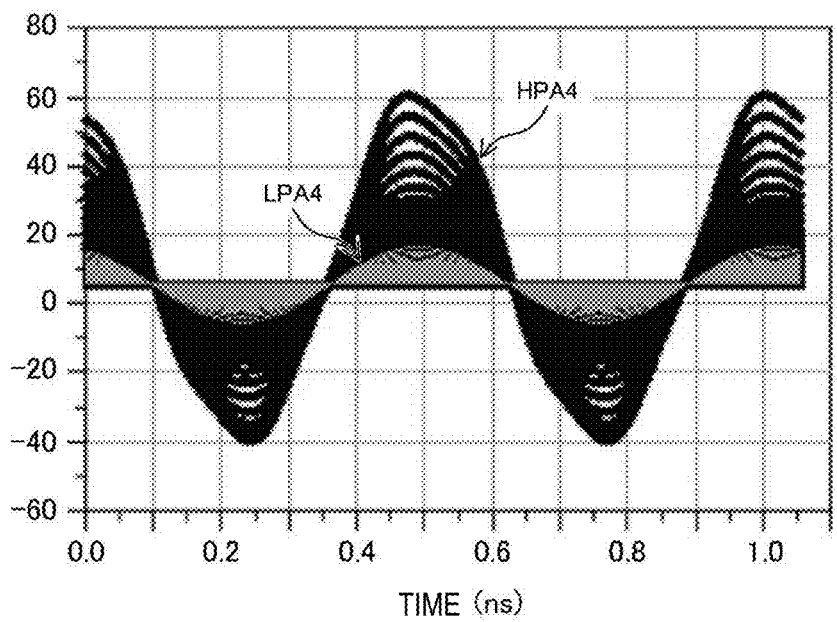
FIG. 12 is a diagram illustrating an exemplary time change in current at the base of an amplifier transistor according to the first embodiment of the present disclosure.

FIG. 12 is a diagram illustrating an exemplary time change in current at the base of an amplifier transistor according to the first embodiment of the present disclosure. FIG. 12 is viewed in the same manner as FIG. 3.

FIG. 12 illustrates current waveform groups HPA4 and LPA4 representing the time change in current at the last-stage HBT bias node 205. The current waveform group HPA4 is a current waveform group at the time of a large-signal operation and corresponds to the voltage waveform group HPV4. The current waveform group LPA4 is a current waveform group at the time of a small-signal operation and corresponds to the voltage waveform group LPV4.

Figure 13:
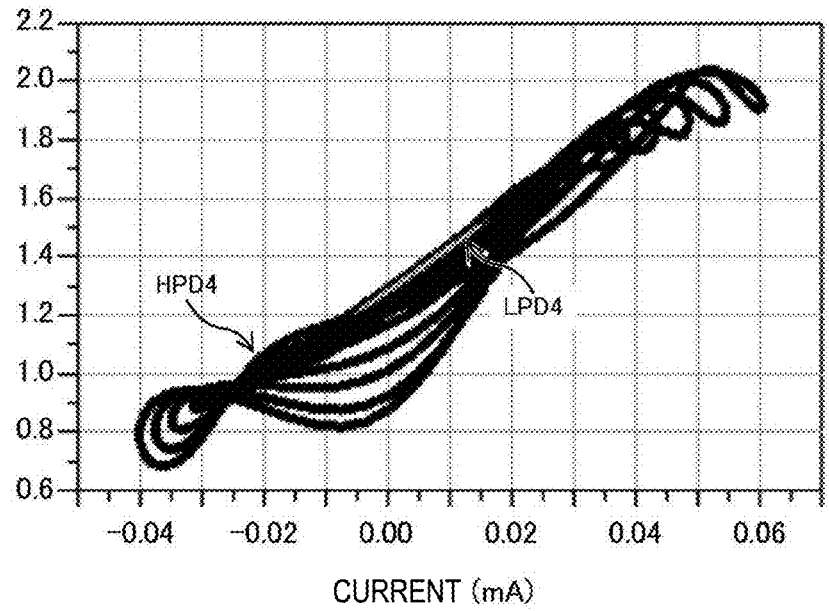
FIG. 13 is a diagram illustrating exemplary current-voltage characteristics at the base of an amplifier transistor according to the first embodiment of the present disclosure.

FIG. 13 is a diagram illustrating exemplary current-voltage characteristics at the base of an amplifier transistor according to the first embodiment of the present disclosure. FIG. 13 is viewed in the same manner as FIG. 4.

FIG. 13 illustrates a dynamic load line HPD4 based on the voltage waveform group HPV4 and the current waveform group HPA4 and a dynamic load line LPD4 based on the voltage waveform group LPV4 and the current waveform group HPA4.

The dynamic load line LPD4 at the time of a small-signal operation is located such that a voltage deceases with decrease in current and a voltage increase with increase in current. Since a current and a voltage are in phase with each other in this case, the AM/PM characteristics of the RF amplifier circuit 11 are improved as compared with the AM/PM characteristics of the second reference circuit.

A region where the dynamic load line LPD4 at the time of a small-signal operation is located is narrower than the region where the dynamic load line LPD3 illustrated in FIG. 10 is located. Accordingly, the AM/AM characteristics of the RF amplifier circuit 11 are improved as compared with the AM/AM characteristics of the third reference circuit.

(AM/AM Characteristics)

Figure 14:
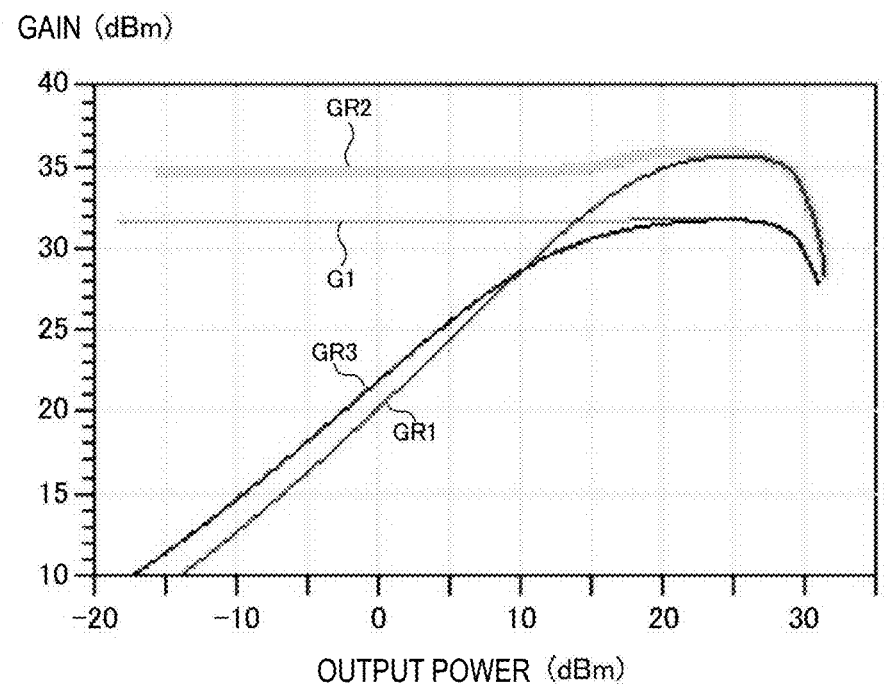
FIG. 14 is a diagram illustrating exemplary AM/AM characteristics of an RF amplifier circuit according to the first embodiment of the present disclosure.

FIG. 14 is a diagram illustrating exemplary AM/AM characteristics of an RF amplifier circuit according to the first embodiment of the present disclosure. In FIG. 14, the horizontal axis represents output power in units of "dBm" and the vertical axis represents gain in units of "dBm".

In this embodiment, a gain curve G1 represents the change in gain with respect to output power in the RF amplifier circuit 11. Output power is the power of the output signal RFout. A gain is a value that is obtained by dividing output power by the power of the input signal RFin (input power) and represented by in units of "dBm".

Gain curves GR1, GR2, and GR3 represent the changes in gain with respect to output power in the first reference circuit, the second reference circuit, and the third reference circuit, respectively.

As illustrated in FIG. 14, the gain curves GR1 and GR3 indicate that the fall of a gain occurs when output power is low. The reason for this is that, in the first reference circuit and the third reference circuit not including the current-mirror-side circuit 311, the supply of a sufficient bias to the last-stage HBT bias node 205 is difficult when output power is low and the amplifier transistor 202 does not appropriately operate.

On the other hand, the gain curves G1 and GR2 indicate that a gain is maintained even when output power is low. The reason for this is that a sufficient bias is supplied to the last-stage HBT bias node 205 because of the presence of the current-mirror-side circuit 311 in the RF amplifier circuit 11 and the second reference circuit even when output power is low.

When output power is high, the change in gain represented by the gain curve G1 is smaller than that represented by the gain curve GR2 and is therefore suitable.

That is, in the RF amplifier circuit 11, since the current-mirror-side circuit 311 supplies a constant idling current to the amplifier transistor 202 at the time of a small-signal operation, excellent AM/AM characteristics can be achieved.

(AM/PM Characteristics)

Figure 15:
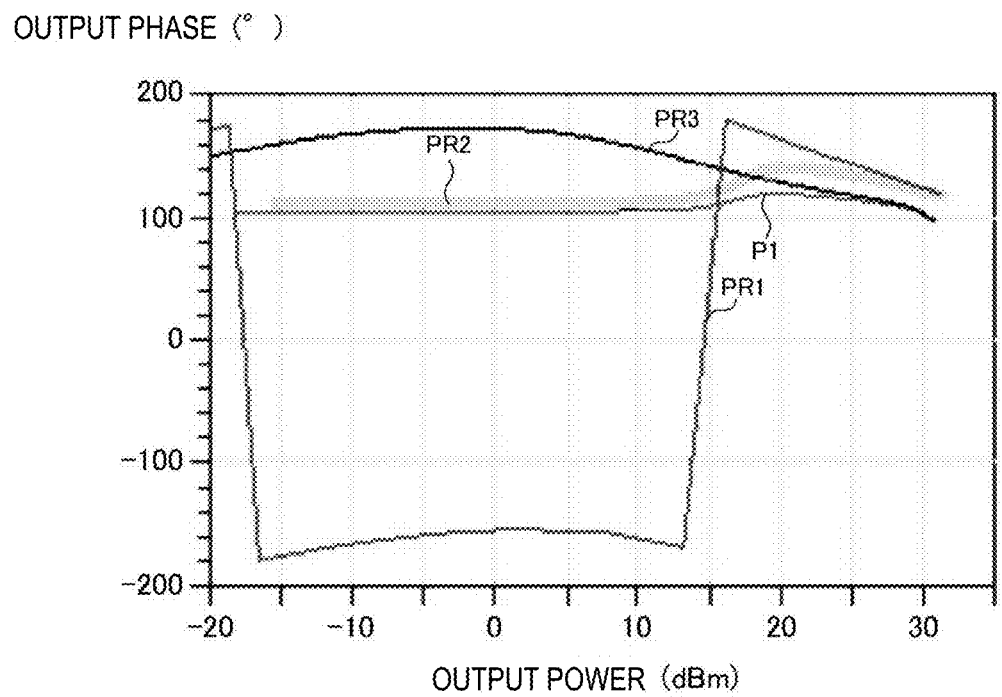
FIG. 15 is a diagram illustrating exemplary AM/PM characteristics of an RF amplifier circuit according to the first embodiment of the present disclosure.

FIG. 15 is a diagram illustrating exemplary AM/PM characteristics of an RF amplifier circuit according to the first embodiment of the present disclosure. In FIG. 15, the horizontal axis represents output power in units of "dBm" and the vertical axis represents an output phase in units of "°".

In this embodiment, a phase curve P1 represents the change in output phase with respect to output power in the RF amplifier circuit 11. Phase curves PR1, PR2, and PR3 represent the changes in output phase with respect to output power in the first reference circuit, the second reference circuit, and the third reference circuit, respectively.

As illustrated in FIG. 15, the changes in output phase with respect to output power represented by the phase curves PR1 and PR3 are large and are not desirable. The change in output phase with respect to output power represented by the phase curve PR2 is suppressed as compared with the changes in output phase with respect to output power represented by the phase curves PR1 and PR3, but is not constant in a region where output power is high. The change in output phase with respect to output power represented by the phase curve P1 is suppressed by the capacitor 331 as compared with the change in output phase with respect to output power represented by the phase curve PR2 even in a region where output power is high.

That is, in the RF amplifier circuit 11, since a current and a voltage can be in phase with each other at the last-stage HBT bias node 205 because of the presence of the capacitor 331, excellent AM/PM characteristics can be achieved.

(Self-Bias Voltage)

Figure 16:
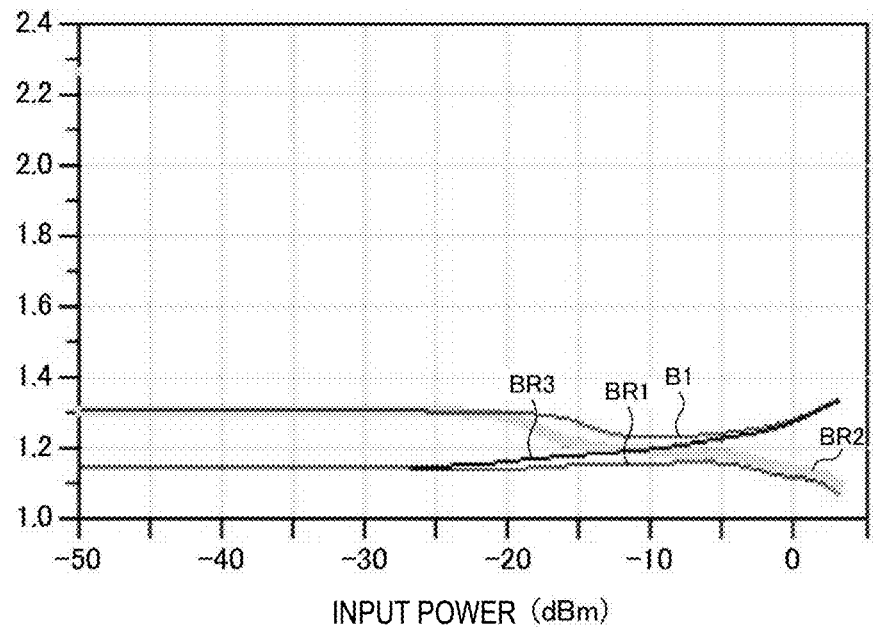
FIG. 16 is a diagram illustrating an exemplary change in bias voltage with respect to input power in an RF amplifier circuit according to the first embodiment of the present disclosure.

FIG. 16 is a diagram illustrating an exemplary change in bias voltage with respect to input power in an RF amplifier circuit according to the first embodiment of the present disclosure. In FIG. 16, the horizontal axis represents input power in units of "dBm" and the vertical axis represents a bias voltage mainly constituted by a self-bias in units of "V". A bias voltage is the voltage of the last-stage HBT bias node 205.

In this embodiment, a bias voltage curve B1 represents the change in bias voltage with respect to input power in the RF amplifier circuit 11. Bias voltage curves BR1, BR2, and BR3 represent the changes in bias voltage with respect to input power in the first reference circuit, the second reference circuit, and the third reference circuit, respectively.

As illustrated in FIG. 16, when input power is greater than or equal to −10 dBm, the bias voltage curves B1 and BR3 indicate that a bias voltage increases with the increase in input power. The reason for this is that, in the RF amplifier circuit 11 and a third reference circuit including the capacitor 331, part of input power is supplied to the last-stage HBT bias node 205 via the capacitor 331 to raise a bias point, that is, increase the contribution ratio of a self-bias to a bias voltage by detection in an HBT in response to the input of power to a power-stage circuit. The increase in bias voltage can lead to the improvement of AM/AM characteristics and AM/PM characteristics.

On the other hand, in the first reference circuit and the second reference circuit not including the capacitor 331, the bias voltage curves BR1 and BR2 indicate that a bias voltage decreases with increase in input power when input power is greater than or equal to −10 dBm.

(Resistance Value of the Resistance Element 313)

Figure 17:
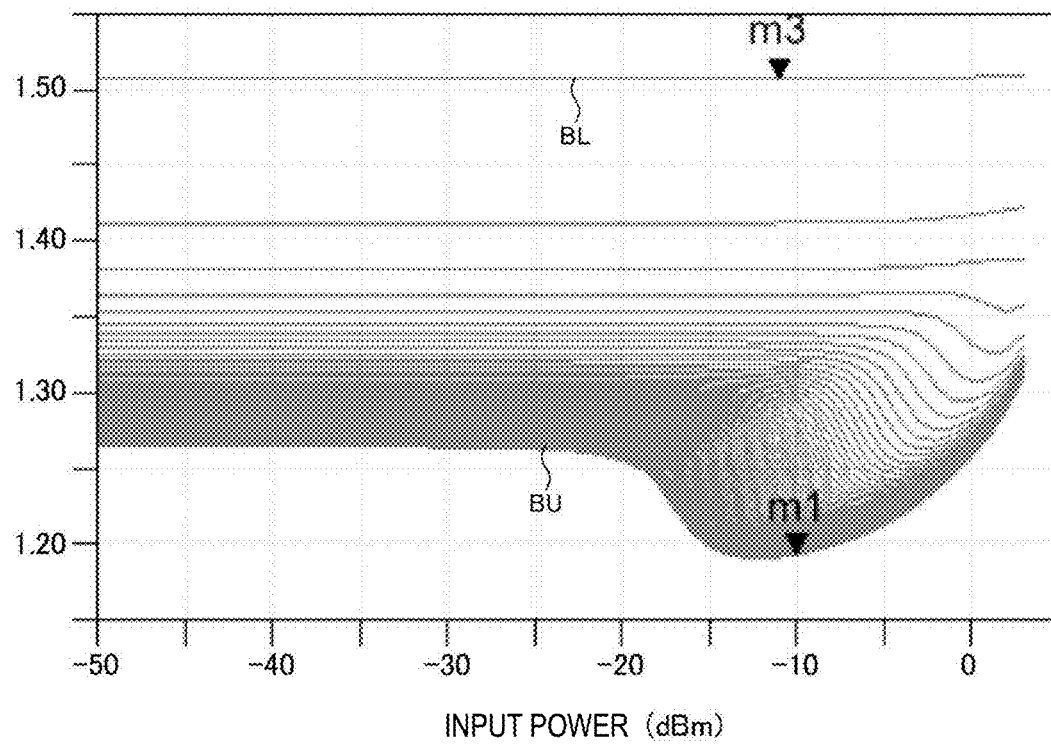
FIG. 17 is a diagram illustrating exemplary changes in bias voltage with respect to input power which correspond to respective resistance values of a resistance element according to the first embodiment of the present disclosure.

FIG. 17 is a diagram illustrating exemplary changes in bias voltage with respect to input power which correspond to respective resistance values of the resistance element 313 according to the first embodiment of the present disclosure. FIG. 17 is viewed in the same manner as FIG. 16.

FIG. 17 illustrates bias voltage curves when the resistance value of the resistance element 313 in the RF amplifier circuit 11 was changed from 1 Ω to 801 Ω in steps of 10 Ω. Bias voltage curves BL and BU represent the changes in bias voltage with respect to input power when the resistance values of the resistance element 313 were 1 Ω and 801 Ω, respectively. Between the bias voltage curves BL and BU, there are bias voltage curves obtained when the resistance value of the resistance element 313 was from 11 Ω to 791 Ω. A bias voltage curve moves in a direction in which a bias voltage increases each time the resistance value of the resistance element 313 decreases by 10 Ω.

Figure 18:
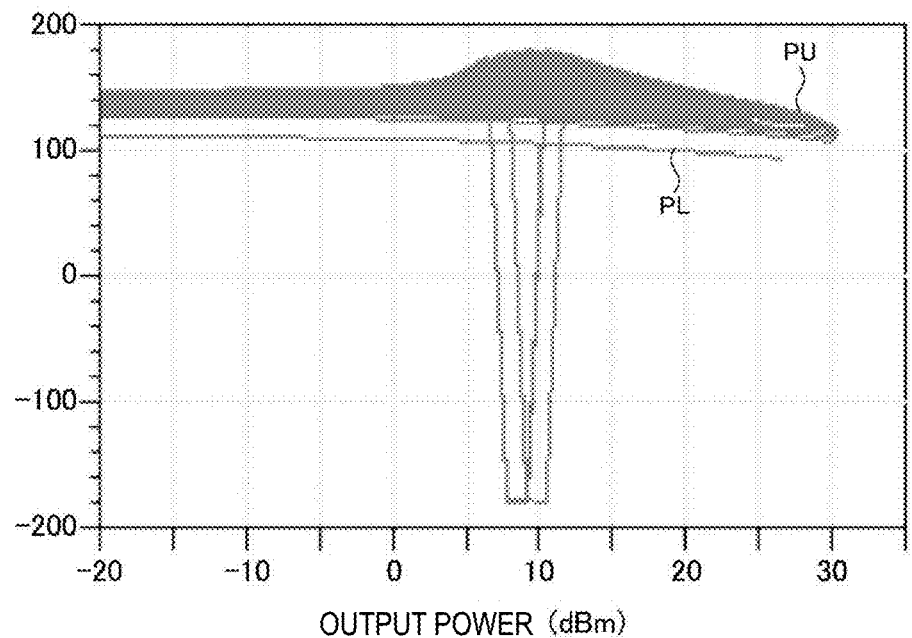
FIG. 18 is a diagram illustrating exemplary AM/PM characteristics of an RF amplifier circuit which correspond to respective resistance values of the resistance element according to the first embodiment of the present disclosure.

FIG. 18 is a diagram illustrating exemplary AM/PM characteristics of an RF amplifier circuit which correspond to respective resistance values of the resistance element 313 according to the first embodiment of the present disclosure. FIG. 18 is viewed in the same manner as FIG. 15.

FIG. 18 illustrates phase curves when the resistance value of the resistance element 313 in the RF amplifier circuit 11 was changed from 1 Ω to 801 Ω in steps of 10 Ω. Phase curves PL and PU represent the changes in output phase with respect to input power when the resistance values of the resistance element 313 were 1 Ω and 801 Ω, respectively. Between the phase curves PL and PU, there are phase curves obtained when the resistance value of the resistance element 313 was from 11 Ω to 791 Ω. A phase curve moves in a direction in which an output phase decreases each time the resistance value of the resistance element 313 decreases by 10 Ω.

As illustrated in FIGS. 17 and 18, with the increase in the resistance value of the resistance element 313, a voltage drop across the resistance element 313 based on a current flowing from the bias transistor 312 to the bias supply node 314 in the current-mirror-side circuit 311 becomes large. Accordingly, with the increase in the resistance value of the resistance element 313, a bias voltage decreases (see FIG. 17).

Since a bias voltage is low when the resistance value of the resistance element 313 is large, a sufficient bias is not supplied to the amplifier transistor 202. Accordingly, the change in output phase with respect to an output voltage becomes large (see FIG. 18). That is, since AM/PM characteristics are deteriorated when the resistance value of the resistance element 313 is greater than or equal to 801 Ω, it is desired that the resistance value of the resistance element 313 be less than or equal to 800 Ω.

Figure 19:
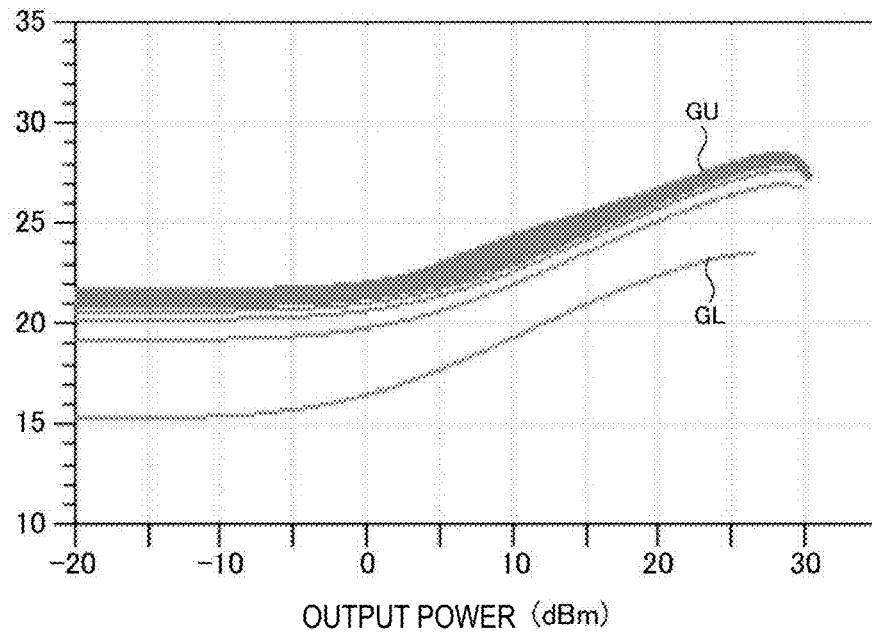
FIG. 19 is a diagram illustrating exemplary AM/AM characteristics of an RF amplifier circuit which correspond to respective resistance values of the resistance element according to the first embodiment of the present disclosure.

FIG. 19 is a diagram illustrating exemplary AM/AM characteristics of an RF amplifier circuit which correspond to respective resistance values of the resistance element 313 according to the first embodiment of the present disclosure. FIG. 19 is viewed in the same manner as FIG. 14.

FIG. 19 illustrates gain curves when the resistance value of the resistance element 313 in the RF amplifier circuit 11 was changed from 1 Ω to 801 Ω in steps of 10 Ω. Gain curves GL and GU represent the changes in gain with respect to output power when the resistance values of the resistance element 313 were 1 Ω and 801 Ω, respectively. Between the gain curves GL and GU, there are gain curves obtained when the resistance value of the resistance element 313 was from 11 Ω to 791 Ω. A gain curve moves in a direction in which a gain decreases each time the resistance value of the resistance element 313 decreases by 10 Ω.

Figure 20:
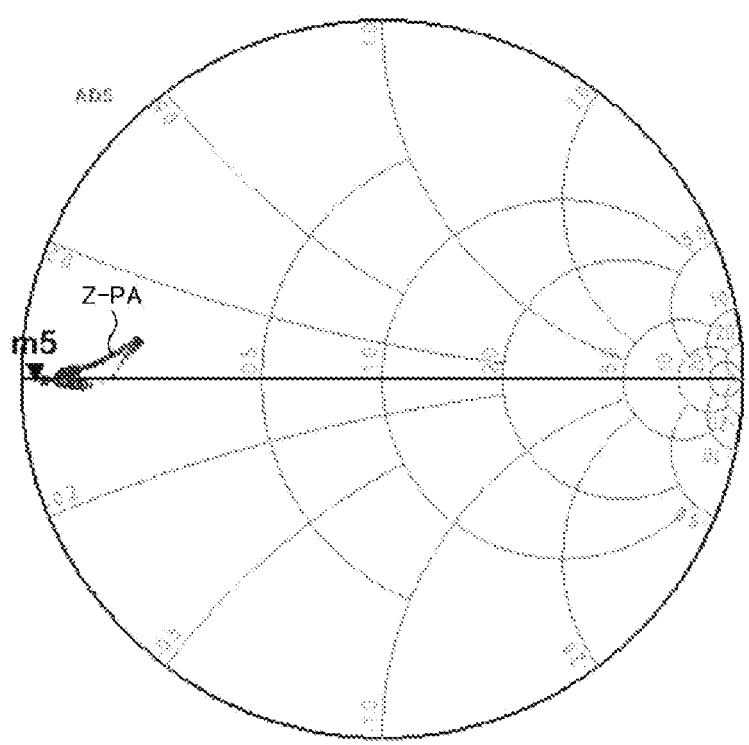
FIG. 20 is a diagram illustrating an exemplary frequency change in impedance in an RF amplifier circuit according to the first embodiment of the present disclosure.

FIG. 20 is a diagram illustrating an exemplary frequency change in an impedance ZL1 in an RF amplifier circuit according to the first embodiment of the present disclosure. FIG. 20 illustrates on a Smith chart a change curve Z-PA based on a simulation result of the impedance ZL1 (see FIG. 1) when the amplifier 201 was viewed from the output terminal 101b of the amplifier 101.

Specifically, the change curve Z-PA was obtained by dividing the calculated value of the impedance ZL1 when a frequency changed from 1.89 GHz to 1.91 GHz at the resistance value of 1 Ω of the resistance element 313 by characteristic impedance. In FIG. 20, "m5" represents the impedance ZL1 at the frequency of 1.91 GHz.

As illustrated in FIGS. 19 and 20, the input impedance of the output-stage (power-stage) amplifier 201 generally has, for example, a small value of approximately 3 Ω. When the resistance value of the resistance element 313 is less than 30 Ω and the impedance of the current mirror circuit decreases, the ratio between the input impedance of the amplifier 201 and the impedance of the current mirror circuit markedly decreases and an interstage loss becomes large. Specifically, since the change curve Z-PA is located apart from the center of the Smith chart as illustrated in FIG. 20 and an impedance is low, it is difficult that an impedance on the side of the bias circuit is made to appear to be high with respect to a power-stage input impedance. That is, since the degree of a cross talk in which RF input power leaks into the side of the bias circuit increases, an interstage matching loss increases and the entire gain of a power amplifier (PA) decreases. Accordingly, since the gain of the RF amplifier circuit 11 decreases when the resistance value of the resistance element 313 is less than 30 Ω (e.g., 1 Ω) as represented by the gain curve GL in FIG. 19, it is desired that the resistance value of the resistance element 313 be greater than or equal to 30 Ω.

[Second Embodiment]

A power amplifier circuit according to the second embodiment will be described. In the second and subsequent embodiments, descriptions of matters common to those in the first embodiment will be omitted and only different points will be described. In particular, descriptions of similar advantageous effects obtained with similar configurations will not be repeated in each of the embodiments.

Figure 21:
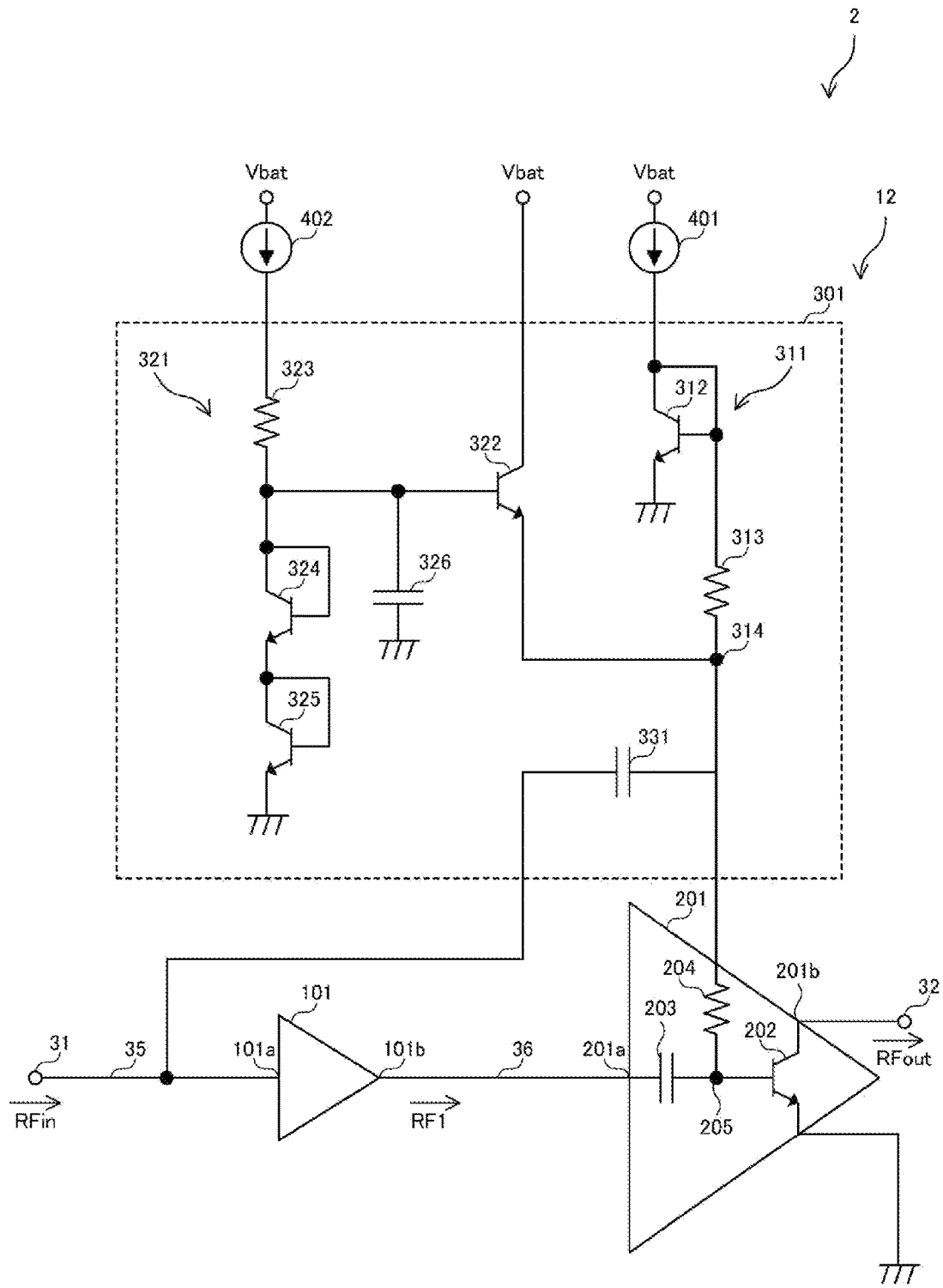
FIG. 21 is a circuit diagram of a power amplifier circuit according to a second embodiment of the present disclosure.

FIG. 21 is a circuit diagram of a power amplifier circuit according to the second embodiment of the present disclosure. An RF amplifier circuit 12 in a power amplifier circuit 2 according to the second embodiment differs from the RF amplifier circuit 11 according to the first embodiment in the point to which the first end of the capacitor 331 is connected as illustrated in FIG. 21.

In the power amplifier circuit 2, the capacitor 331 in the bias circuit 301 has a first end connected to the RF signal input terminal 31 and the input terminal 101a of the amplifier 101 and a second end connected to the bias supply node 314.

[Third Embodiment]

Figure 22:
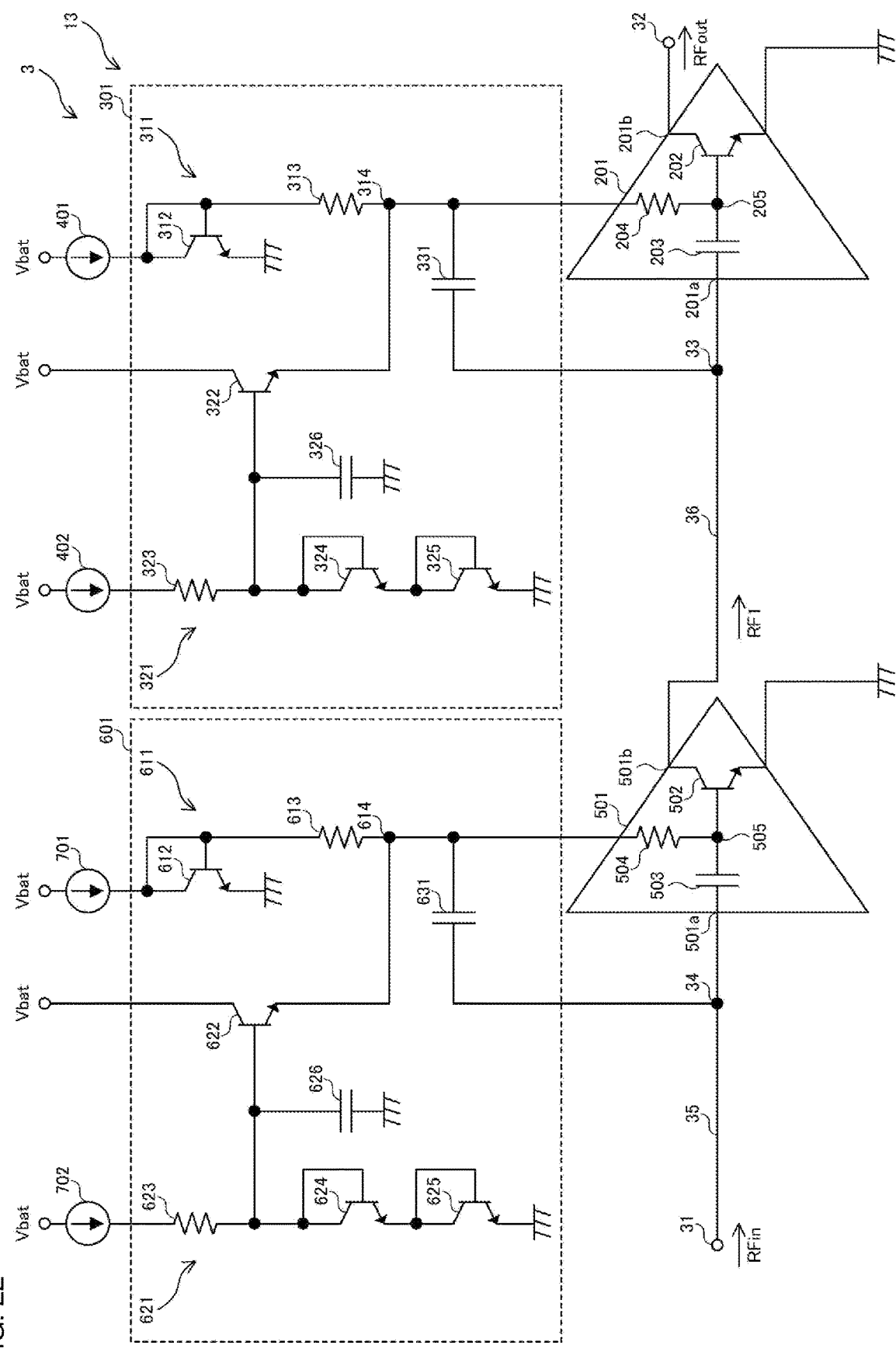
FIG. 22 is a circuit diagram of a power amplifier circuit according to a third embodiment of the present disclosure.

A power amplifier circuit according to the third embodiment will be described. FIG. 22 is a circuit diagram of a power amplifier circuit according to the third embodiment of the present disclosure. A power amplifier circuit 3 according to the third embodiment differs from the power amplifier circuit 1 according to the first embodiment in that it includes an RF amplifier circuit 13 and current sources 701 and 702 instead of the RF amplifier circuit 11 as illustrated in FIG. 22. The RF amplifier circuit 13 further includes an amplifier 501 and a bias circuit 601 in addition to the components in the RF amplifier circuit 11 illustrated in FIG. 1. The amplifier 501, the bias circuit 601, and the current sources 701 and 702 have the respective same configurations as the amplifier 201, the bias circuit 301, and the current sources 401 and 402, respectively.

The amplifier 501 has an input terminal 501a connected to the RF signal input terminal 31 to which the input signal RFin is supplied through the wiring line 35 and an output terminal 501b connected to the wiring line 36 in which the interstage node 33 is provided. The amplifier 501 amplifies the input signal RFin input from the input terminal 501a and outputs the amplification signal RF1, which is a result of the amplification, from the output terminal 501b.

Specifically, the amplifier 501 further includes an amplifier transistor 502 (second amplifier transistor), a capacitor 503, and a resistance element 504. The capacitor 503 functions as a matching circuit that performs impedance matching between a device in a stage preceding the power amplifier circuit 3 and the amplifier transistor 502 and has a first end connected to the input terminal 501a and a second end connected to a first-stage HBT bias node 505.

The resistance element 504 has a first end connected to a bias supply node 614 to which a bias is supplied from the bias circuit 601 and a second end connected to the first-stage HBT bias node 505. The amplifier transistor 502 has a collector connected to the output terminal 501b, a base connected to the first-stage HBT bias node 505, and a grounded emitter. The amplifier transistor 502 amplifies the input signal RFin supplied to the base thereof and outputs the amplification signal RF1, which is a result of the amplification, to the amplifier 201 through the output terminal 501b. Although not illustrated, a power supply voltage is supplied to the collector of the amplifier transistor 502. In the wiring line connecting the collector of the amplifier transistor 502 and a power supply, for example, a resistance element, a capacitor, and an inductor may be provided.

Each of the current sources 701 and 702 is formed of, for example, a PMOS and has a first end connected to a power supply node to which the battery voltage Vbat is supplied and a second end from which a current is output.

The bias circuit 601 includes a current-mirror-side circuit 611, an emitter-follower-side circuit 621, and a capacitor 631 (second capacitor). The bias circuit 601 supplies a bias to the amplifier transistor 502 in the amplifier 501 in accordance with currents received from the current sources 701 and 702.

The emitter-follower-side circuit 621 has the same configuration as the emitter-follower-side circuit 321 and includes a bias transistor 622 (fourth bias transistor), a resistance element 623, transistors 624 and 625, and a capacitor 626. The emitter-follower-side circuit 621 supplies a bias to the base of the amplifier transistor 502 in accordance with a current supplied from the current source 702.

Specifically, the resistance element 623, the transistors 624 and 625, and the capacitor 626 supply a bias having a predetermined voltage to the base of the bias transistor 622. More specifically, the resistance element 623 includes a first end to which a current is supplied from the current source 702 and a second end. The transistor 624 is diode-connected and has a collector connected to the second end of the resistance element 623 and an emitter. The transistor 625 is diode-connected and has a collector connected to the emitter of the transistor 624 and a grounded emitter. Since each of the transistors 624 and 625 functions as a diode, a voltage drop across two diodes occur in collector-emitter paths of the transistors 624 and 625. That is, a collector-base voltage of the transistor 624 with respect to the ground corresponds to the amount of the voltage drop across two diodes.

The capacitor 626 has a first end connected to the second end of the resistance element 623 and the collector of the transistor 624 and a grounded second end. The capacitor 626 stabilizes the collector-base voltage of the transistor 624.

The bias transistor 622 is connected to the base of the amplifier transistor 502 to form an emitter follower and supplies a bias to the base of the amplifier transistor 502. Specifically, the bias transistor 622 has a collector connected to the power supply node to which the battery voltage Vbat is supplied, a base connected to the second end of the resistance element 623, the collector of the transistor 624, and the first end of the capacitor 626, and an emitter connected to the bias supply node 614. Since the emitter of the bias transistor 622 is connected to the base of the amplifier transistor 502 via the resistance element 504, the bias transistor 622 and the resistance element 504 form an emitter-follower circuit.

The current-mirror-side circuit 611 includes a bias transistor 612 (third bias transistor) and a resistance element 613 (second resistance element). The bias transistor 612 is connected to the amplifier transistor 502 to form a current mirror and supplies a bias to the base of the amplifier transistor 502. Specifically, the bias transistor 612 is diode-connected and has a collector to which a current is supplied from the current source 701 and a grounded emitter.

The resistance element 613 has a first end connected to the collector and base of the bias transistor 612 and a second end connected to the bias supply node 614. It is desired that the resistance value of the resistance element 613 be from 30 Ω to 800 Ω for the same reason as the resistance value of the resistance element 313.

Since the base of the diode-connected bias transistor 612 is connected to the base of the amplifier transistor 502 via the resistance elements 613 and 504, the bias transistor 612 and the amplifier transistor 502 form a current mirror circuit. When a current flows through the collector of the bias transistor 612, a current corresponding to the size ratio between the bias transistor 612 and the amplifier transistor 502 flows through the collector of the amplifier transistor 502.

The capacitor 631 has the same function as the capacitor 331 and has a first end connected to an input-end-side node 34 in the wiring line 35 and a second end connected to the bias supply node 614.

Although the RF amplifier circuit 11 in the power amplifier circuit 1 according to this embodiment includes the amplifier 101, the RF amplifier circuit 11 does not necessarily have to include the amplifier 101 and includes only the amplifier 201 and the bias circuit 301.

Exemplary embodiments of the present disclosure have been described above. Each of the RF amplifier circuits 11, 12, and 13 includes the amplifier transistor 202 configured to amplify and output the amplification signal RF1 supplied to the base thereof, the bias transistor 312 that is connected to the amplifier transistor 202 to form a current mirror and configured to supply a bias to the base of the amplifier transistor 202, the bias transistor 322 that is connected to the base of the amplifier transistor 202 to form an emitter follower and configured to supply a bias to the base of the amplifier transistor 202, and the capacitor 331 having the first end connected to the base of the amplifier transistor 202 and the second end connected to the emitter of the bias transistor 322.

When a voltage supplied to the bias transistor 322 is low, a sufficient bias cannot be supplied to the amplifier transistor 202 only by the bias transistor 322, which is connected to the base of the amplifier transistor 202 to form an emitter follower, when the power of an input signal is low and AM/AM characteristics are sometimes deteriorated. With the configuration in which the bias transistor 312 that is connected to the amplifier transistor 202 to form a current mirror is provided, a constant idling current can be supplied to the amplifier transistor 202 by the bias transistor 312 even when a voltage supplied to the bias transistor 322 is low. Accordingly, the fall of a gain when the power of an input signal is low can be suppressed. That is, excellent AM/AM characteristics can be achieved. In the case of a configuration in which the capacitor 331 is not provided, the voltage and current of a bias supplied from the bias transistors 312 and 322 to the base of the amplifier transistor 202 are out of phase with each other. Accordingly, the output phase of the output signal RFout significantly changes in accordance with the signal level of the output signal RFout. That is, AM/PM characteristics are deteriorated. With the configuration in which the capacitor 331 is provided between the base of the amplifier transistor 202 to which the amplification signal RF1 is supplied and the emitter of the bias transistor 322, part of the amplification signal RF1 can be supplied to the emitter of the bias transistor 322 via the capacitor 331. As a result, the voltage and current of a bias supplied to the base of the amplifier transistor 202 can be in phase with each other and the change in the output phase of the output signal RFout with respect to the signal level of the output signal RFout can be suppressed. That is, excellent AM/PM characteristics can be achieved. Accordingly, there can be provided an RF amplifier circuit capable of suppressing the change in the output phase of an output signal irrespective of the signal level of the output signal.

Each of the RF amplifier circuits 11, 12, and 13 further includes the resistance element 313 connected between the base of the bias transistor 312 and the emitter of the bias transistor 322.

With this configuration, a current flowing through the bias transistor 312 can be adjusted and AM/AM characteristics and AM/PM characteristics can be improved.

In each of the RF amplifier circuits 11, 12, and 13, the resistance value of the resistance element 313 is from 30 Ω to 800 Ω.

For example, when the resistance value of the resistance element 313 is less than 30 Ω, the gain of the RF amplifier circuit 11 sometimes decreases. For example, when the resistance value of the resistance element 313 is greater than 800 Ω, a voltage drop across the resistance element 313 increases. In this case, it is difficult that a sufficient bias is supplied to the amplifier transistor 202. Since the bias voltage of a power-stage HBT is low, AM/PM characteristics are easily deteriorated. With the configuration in which the resistance value of the resistance element 313 is from 30 Ω to 800 Ω, the supply of a sufficient bias to the amplifier transistor 202 and the improvement of AM/PM characteristics can be achieved while the suppression of decease in the gain of the RF amplifier circuit 11 and the improvement of AM/AM characteristics can be achieved.

The RF amplifier circuit 12 further includes the amplifier 101 connected between the first end of the capacitor 331 and the base of the amplifier transistor 202.

With the configuration in which the first end of the capacitor 331 is connected to the input terminal of the first-stage amplifier 101, part of the input signal RFin can be supplied to the emitter of the bias transistor 322 via the capacitor 331 before being amplified by the amplifiers in the two stages. This configuration is used for the application that mainly uses a low-power range as the power dynamic range of input power using a self-bias effect and causes a bias to accurately follow input power. Since the voltage and current of a bias supplied to the amplifier transistor 202 can be adjusted in accordance with the input signal RFin of low power with this configuration, AM/PM characteristics can be effectively improved.

The RF amplifier circuit 13 further includes the amplifier transistor 502 configured to amplify the input signal RFin input to the base thereof and output the amplified signal to the base of the amplifier transistor 202, the bias transistor 612 that is connected to the amplifier transistor 502 to form a current mirror and configured to supply a bias to the base of the amplifier transistor 502, the bias transistor 622 that is connected to the base of the amplifier transistor 502 to form an emitter follower and configured to supply a bias to the base of the amplifier transistor 502, and the capacitor 631 having the first end connected to the base of the amplifier transistor 502 and the second end connected to the emitter of the bias transistor 622.

Even when two stages of amplifier transistors are provided, the supply of a bias to each of the amplifier transistors in the respective stages can be appropriately performed with this configuration. This leads to the achievement of excellent AM/AM characteristics and excellent AM/PM characteristics. Three or more stages of amplifier transistors may be provided.

The RF amplifier circuit 13 further includes the resistance element 613 connected between the base of the bias transistor 612 and the emitter of the bias transistor 622.

With this configuration, a current flowing through the bias transistor 612 can be adjusted and AM/AM characteristics and AM/PM characteristics can be improved.

In the RF amplifier circuit 13, the resistance value of the resistance element 613 is from 30 Ω to 800 Ω.

With the configuration, the supply of a sufficient bias to the amplifier transistor 502 and the improvement of AM/PM characteristics can be achieved while the suppression of decease in the gain of the RF amplifier circuit 13 and the improvement of AM/AM characteristics can be achieved.

The embodiments described above are intended to help easily understand the present disclosure and are not to be used to construe the present disclosure in a limiting fashion. The present disclosure may be modified or improved without necessarily departing from the gist thereof, and equivalents of such modifications or improvements are also included in the present disclosure. That is, the embodiments may be appropriately modified in design by those skilled in the art, and such modifications also fall within the scope of the present disclosure so long as the modifications include the features of the present disclosure. For example, elements included in the embodiments and the arrangements, materials, conditions, shapes, sizes, and so on thereof are not limited to those illustrated exemplarily but can be modified as appropriate. The embodiments are merely illustrative, configurations according to different embodiments may be partially exchanged or combined, and such exchanges or combinations of configurations also fall within the scope of the present disclosure so long as the exchanges or combinations of configurations include the features of the present disclosure.

While preferred embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A radio-frequency amplifier circuit comprising:
   a first amplifier transistor configured to amplify and output a radio-frequency signal supplied to a base of the first amplifier transistor;
   a first bias transistor that is connected to the first amplifier transistor, thereby forming a current mirror, and that is configured to supply a first bias to the base of the first amplifier transistor;
   a second bias transistor that is connected to the base of the first amplifier transistor via a bias supply node, thereby forming an emitter follower, and that is configured to supply a second bias to the base of the first amplifier transistor; and
   a first capacitor having a first end connected to the base of the first amplifier transistor and a second end connected to an emitter of the second bias transistor via the bias supply node,
   wherein a part of the radio-frequency signal is supplied to the bias supply node via the first capacitor.

2. The radio-frequency amplifier circuit according to claim 1, further comprising a first resistance element connected between the base of the first bias transistor and the emitter of the second bias transistor.

3. The radio-frequency amplifier circuit according to claim 2, wherein a resistance value of the first resistance element is from 30 Ω to 800 Ω.

4. The radio-frequency amplifier circuit according to claim 1, further comprising an amplifier connected between the first end of the first capacitor and the base of the first amplifier transistor.

5. The radio-frequency amplifier circuit according to claim 2, further comprising an amplifier connected between the first end of the first capacitor and the base of the first amplifier transistor.

6. The radio-frequency amplifier circuit according to claim 3, further comprising an amplifier connected between the first end of the first capacitor and the base of the first amplifier transistor.

7. The radio-frequency amplifier circuit according to claim 1, further comprising:
   a second amplifier transistor configured to amplify a radio-frequency signal input to a base of the second amplifier transistor, and to output the amplified signal to the base of the first amplifier transistor;
   a third bias transistor that is connected to the second amplifier transistor, thereby forming a second current mirror, and that is configured to supply a third bias to the base of the second amplifier transistor;
   a fourth bias transistor that is connected to the base of the second amplifier transistor, thereby forming a second emitter follower, and that is configured to supply a fourth bias to the base of the second amplifier transistor; and
   a second capacitor having a first end connected to the base of the second amplifier transistor and a second end connected to an emitter of the fourth bias transistor.

8. The radio-frequency amplifier circuit according to claim 7, further comprising a second resistance element connected between a base of the third bias transistor and the emitter of the fourth bias transistor.

9. The radio-frequency amplifier circuit according to claim 8, wherein a resistance value of the second resistance element is from 30 Ω to 800 Ω.

\* \* \* \* \*